(12) United States Patent
Olguin

(10) Patent No.: US 7,772,857 B2
(45) Date of Patent: Aug. 10, 2010

(54) SYSTEM AND METHOD TO DETERMINE THE IMPEDANCE OF A DISCONNECTED ELECTRICAL FACILITY

(75) Inventor: Gabriel Olguin, Santiago (CL)

(73) Assignee: ABB Research Ltd. (CH)

( * ) Notice: Subject to any disclaimer, the term of this patent is extended or adjusted under 35 U.S.C. 154(b) by 0 days.

(21) Appl. No.: 12/489,039

(22) Filed: Jun. 22, 2009

(65) Prior Publication Data

US 2010/0013498 A1   Jan. 21, 2010

Related U.S. Application Data

(63) Continuation of application No. PCT/EP2007/064458, filed on Dec. 21, 2007.

(30) Foreign Application Priority Data

Dec. 22, 2006  (EP) ................. 06126985

(51) Int. Cl.
*G01R 27/08* (2006.01)
*H02H 3/00* (2006.01)
*H02H 7/00* (2006.01)

(52) U.S. Cl. .................. 324/713; 324/707; 361/1

(58) Field of Classification Search ........... 324/713, 324/691, 649, 600, 602, 603, 605, 707, 522, 324/523, 525; 361/47, 62, 90, 63, 65, 78, 361/79; 702/57, 58, 64, 183, 193

See application file for complete search history.

(56) References Cited

U.S. PATENT DOCUMENTS 3,728,582 A * 4/1973 Agnew ............... 361/48

4,228,475 A 10/1980 Sherwood (Continued)

FOREIGN PATENT DOCUMENTS

DE   3429150 A1   2/1986

(Continued)

OTHER PUBLICATIONS

Zaengl, W.S.; "Dielectric Spectroscopy in Time and Frequency Domain for HV Power Equipment, Part I: Theoretical Considerations" IEEE Electrical Insulation Magazine, vol. 19, issue 5, Aug. 2001; pp. 5-19.

(Continued)

Primary Examiner—Hoai-An D Nguyen
(74) Attorney, Agent, or Firm—St. Onge Steward Johnston & Reens LLC

(57) ABSTRACT

A signal injection unit injects a test signal at a main frequency between a reference point of an electric circuit and ground, where the electric circuit is connected with the facility and injects another test signal at a second main frequency between a reference point of the electric circuit and ground. A signal conversion unit measures first and second response voltages and first and second response currents in the electric circuit, where the response voltages and the response currents result from the test signals. A processing device determines impedances to ground of the facility from the response voltages and the response currents, analyses impedances to ground of the facility, where this analysing includes comparing each determined impedance to ground with a predetermined value, and determines a safety state of the disconnected electrical facility based on the analysed impedances to ground.

20 Claims, 3 Drawing Sheets

U.S. PATENT DOCUMENTS 5,341,268 A * 8/1994 Ishiguro et al. ............... 361/62
5,818,245 A    10/1998 Allfather
6,456,097 B1   9/2002 Sutherland
6,718,271 B1 * 4/2004 Tobin .......................... 702/58
7,508,224 B2 * 3/2009 Williams ................... 324/707

FOREIGN PATENT DOCUMENTS

| | | | |
|---|---|---|---|
| EP | 0435405 | A1 | 7/1991 |
| EP | 1890369 | A1 | 2/2008 |
| JP | 51122739 | A * | 10/1976 |
| JP | 2003217407 | A | 7/2003 |
| WO | 0038289 | A1 | 6/2000 |

OTHER PUBLICATIONS

International Search Report & Written Opinion of the International Searching Authority; PCT/EP20071064458; Apr. 4, 2008; 9 pages.

* cited by examiner

SYSTEM AND METHOD TO DETERMINE THE IMPEDANCE OF A DISCONNECTED ELECTRICAL FACILITY

CROSS-REFERENCE TO RELATED APPLICATIONS

The present application is a continuation of International patent application PCT/EP2007/064458 filed on Dec. 21, 2007 which designates the United States and claims priority from European patent application EP06126985.8 filed on Dec. 22, 2006, the content of which is incorporated herein by reference.

FIELD OF THE INVENTION

The invention relates to a system and a method to determine the impedance of an electrical facility being disconnected from its high or medium voltage power supply.

BACKGROUND OF THE INVENTION

An electrical facility is an installation or device, the operating current of which is high enough to become dangerous for an operator or to cause some damage in the surrounding equipment in case of an unwanted earthing. This is usually true for all high and medium voltage facilities used in power generation, transmission and distribution. Whenever maintenance or repair work is to be done on the electrical facility, the facility is disconnected from its power supply and a safety ground connector is installed manually or automatically.

To forget the safety ground can have serious consequences in mainly two different situations. First, in case that the safety ground is not properly installed on the facility and that a worker approaches. Even though the facility is no longer energized itself, it may have picked up induced voltages from energized equipment in its neighbourhood. In the worst case, this situation can be fatal for the worker. The second situation, where a safety ground should not be forgotten, is before the reconnection of the facility to its power supply. If the safety ground connector was forgotten to be removed after finishing the maintenance, an unwanted earthing of the facility occurs. This may cause severe destructions.

The electrical facility may furthermore be temporarily disconnected from the power supply for other reasons than because of maintenance. One such reason is if it is subject to a self clearing fault during operation, like for instance being subject to a short-circuit fault caused by the electrical facility being struck by lightning. In such circumstances the electrical facility is normally disconnected for a certain time period and then it may be reconnected. Such practice is commonly known as reclosing and aims at increasing the continuity of power supply to the electrical facility. However, before it is reconnected any faults that are still present should be removed. Moreover in order to remove a permanent fault an estimation of the location may be needed.

The current invention presents a solution where such safety measures can be provided in a secure way so that an appropriate reaction can be initiated.

A forgotten safety ground or such a short-circuit fault has especially severe consequences in case of a three-phase electrical facility, such as a transformer or a capacitor bank in a substation of a power network or a three-phase power transmission or distribution line. A three-phase fault generally has a very severe impact on the electrical facility and its surrounding equipment. Three-phase faults spread over a large area of the related power network as a sudden depression of voltage or voltage sag, which might trip sensitive devices. The efforts needed to reinstate the devices and the power network, are of serious concern.

Today more stringent constraints are being established by regulatory bodies to limit both the number and the duration of interruptions in the power supply to end customers. These increasing demands on power transmission and distribution companies leave them with little time and few disconnections for scheduled maintenance of lines and substations. Transmission and distribution companies nowadays rely on several external contractors for the execution of the annual maintenance plan which is usually done in one or two annual disconnections of the line or substation. The coordination of maintenance work is difficult, particularly when several crews from different contractors work simultaneously in different points of a line or substation. For safety reasons, each point of work must be grounded at any incoming point. The restoration of the power supply needs to be completed once the maintenance work is done. It is both during the grounding as well as the power supply restoration process where coordination and communication must be perfect to avoid errors that endanger the maintenance personnel, increase the duration of the interruption or cause severe hardware problems. Nowadays, the application and the removal of the safety grounds are checked manually which require considerable man power. And statistics show that in most accidents on power facilities leading to personal injuries or three-phase faults of a line or substation, human errors are involved.

As an alternative solution to the manual checking of the safety grounds, the WO 00/38289 proposes a system for warning regarding the presence of manually attached ground contacts on a high voltage conductor. The system comprises an additional and naked conductor close to the high voltage conductor, which is clamped resiliently to the high voltage conductor when the safety ground is attached. A warning device senses if the additional conductor is in contact with the high voltage conductor and transmits a warning signal to an operational central unit. The central unit makes it then impossible to connect a high voltage to ground to the high voltage conductor. The hardware needed for this warning system is considerable; in particular the additional conductor makes the installation costly.

It is therefore an object of the present invention to provide a system and a method with which the impedance of an electrical facility being disconnected from its high or medium voltage power supply can be determined automatically and at comparatively low costs. This may in turn be used to determine if there is a safety ground present or if a short-circuit fault is still in existence whenever the electrical facility is not energised.

SUMMARY OF THE INVENTION

The object is achieved by the provision of a system and method as outlined below.

A system to determine the impedance of an electrical facility being disconnected from its high or medium voltage power supply, characterized by a signal injection unit arranged to inject a test signal at a first main frequency between a reference point of an electric circuit and ground and to inject another test signal at a second main frequency between a reference point of the electric circuit and ground, where the electric circuit is connected with the facility, a signal conversion unit arranged to measure a first response voltage and a first response current in the electric circuit, where the first response voltage and the first response current result from the test signal and to measure a second response voltage and a second response current as a result to the other test signal, a processing device arranged to determine an impedance to ground of the facility from the first response voltage and the first response current and to determine another impedance to ground from the second response voltage and second response current, to analyse impedances to ground of the facility, said analysing including comparing each determined impedance to ground with a predetermined value, and to determine a safety state of the disconnected electrical facility based on the analysed impedances to ground.

A method to determine the impedance of an electrical facility being disconnected from its high or medium voltage power supply, characterized by injecting a test signal at a main frequency between a reference point of an electric circuit and ground and injecting another test signal at a second main frequency between a reference point of the electric circuit and ground, where the electric circuit is connected with the facility, measuring a first response voltage and a first response current in the electric circuit, where the first response voltage and the first response current result from the test signal, measuring a second response voltage and a second response current as a result to the other test signal, determining an impedance to ground of the facility from the first response voltage and the first response current and determining another impedance to ground from the second response voltage and second response current, analysing the impedances to ground of the facility, said analysing including comparing each determined impedance to ground with a predetermined value and determining a safety state of the disconnected electrical facility based on the analysed impedances to ground.

The invention is based on the general idea, that a safety ground shows electrically the same behaviour as a ground fault of the line or winding to which the safety ground was attached; i.e a low impedance to ground should be detectable.

The detection of the impedance of a power facility or device is known in the art of monitoring the fault state of power devices such as generators, transformers or transmission lines.

In "Dielectric Spectroscopy in Time and Frequency Domain for HV Power Equipment, Part I: Theoretical Considerations" by Zaengl, W. S.; IEEE Electrical Insulation Magazine, vol. 19, issue 5, pages 5-19, the method of dielectric spectroscopy is introduced as a means to diagnose electric insulation materials used in power engineering. Dielectric spectroscopy may also be called impedance spectroscopy, and it is based on the reaction of a material to an applied electromagnetic field at a certain frequency. In most general terms, the response of the material to the applied AC field is determined by measuring the complex voltage and the complex current over the material simultaneously and by determining the impedance of the material at the specific frequency.

In the European patent application 06445061.2, the method of dielectric spectroscopy is used to improve the accuracy of a ground fault detection method applied to a stator winding of a multiple-phase generator. A ground fault in the stator winding, which is an internal fault and which can be caused by physical damage or ageing of the insulation material of the winding, precedes generally all other possible faults of the generator, such as phase-to-phase faults of the stator. Accordingly, it is useful to detect the ground fault in the winding to prevent more severe faults in the generator. The stator of the generator is wye connected and the neutral point is connected to ground. For the dielectric spectroscopy, an AC test signal is injected between the neutral point and ground and the response of the stator to that AC signal is measured. From the measurements, a fault impedance to ground is determined, where the fault impedance is modelled as a fault resistance in parallel to a capacitance to ground.

Accordingly, the object of the present invention is solved by a system and a corresponding method performed by the system, where the system comprises a signal injection unit to inject a test signal at a main frequency between a reference point of an electric circuit and ground, where the electric circuit is connected with the facility, and injects another test signal at a second main frequency between a reference point of the electric circuit and ground, a signal conversion unit to measure a first response voltage and a first response current in the electric circuit, where the first response voltage and the first response current result from the test signal and to measure a second response voltage and a second response current as a result to the other test signal and a processing device to determine an impedance to ground of the facility from the first response voltage and the first response current and to determine another impedance to ground from the second response voltage and second response current, to analyse the impedances to ground of the facility, said analysing including comparing each determined impedance to ground with a predetermined value and to determine a safety state of the disconnected electrical facility based on the analysed impedances to ground.

By injecting two different frequencies instead of just one frequency, the reliability of the determination of the safety state is improved. Therefore redundancy of the impedance determination is achieved.

The comparison of the impedance with the predetermined value may be understood as either the comparison of the real part of the measured impedance with a predetermined resistance value or as the comparison of the impedance in the complex plane with a predetermined range, where the range can for example be described by a circle in the complex plane and where the measured impedance must be lying inside the circle.

In case, according to some embodiments of the present invention, the safety state indicates an existing safety ground and the maintenance work is still ongoing, the presence of this safety ground may be taken as a positive confirmation that the facility is free of dangerous charges. In case that the maintenance work has been finished and the power supply is about to be reconnected to the electrical facility, the safety state indicating an existing safety ground indicates an error. Accordingly, the reconnection must be postponed until the safety ground is removed.

In case the safety state indicates a permanent short circuit fault for an electrical facility being disconnected during operation, reconnection of the device will also be postponed.

According to one embodiment of the present invention also the distance to the fault can be calculated.

Since no interaction with the maintenance personnel is required, the proposed system and method determines the impedance to ground completely automatically.

The processing device of the system may be arranged preferably in proximity to the electrical facility, for example as part of a multi-purpose protection relay. Alternatively it can be placed in a central monitoring unit, which monitors the presence of safety grounds in a multiple of facilities.

Since processing devices in form of protection relays or of central monitoring units are already widely used in today's power systems, the only additionally hardware units required to carry out the invention are the injection and the signal conversion units. These consist of electrical and electronic components, which are comparatively inexpensive compared to the main power required to check the safety ground manually or to the installation and material effort required for an additional conductor along a line.

The injected test signal can be a voltage or current signal. The term main frequency illustrates that the test signal is a time-varying signal the frequency spectrum of which shows one clearly dominating frequency. The simplest embodiment is a sinusoidal test signal. But a composition of different frequencies is also applicable as long as main frequencies can be detected.

The facilities, where the proposed system and method can advantageously be applied, are for example a power transmission or distribution line, a capacitor bank in a power network or a transformer or a breaker in a substation of a power network.

In case the determined safety state concerns an existing safety ground, this state may be signalled to a control unit, whereupon the control unit initiates an alarm signal, if the maintenance work is ongoing and if it is not signalled that the safety ground is present. In case the maintenance work has been completed and the processing device signals a present safety ground, the control unit prevents the application of a high or medium voltage to the electrical facility thereby preventing a destructive phase-to-ground-current flow. If the control unit receives the signals relating to all safety grounds in a power network, the control unit is able to ensure that all safety grounds have been properly installed before maintenance or removed before the power supply is restored, which increases the safety and the availability of the power network.

As already described, the processing device may be a multi-purpose protection relay, also called an Intelligent Electronic Device (IED). In such IEDs, measurements are commonly received via so called transmission channels as analogue signals, so that the number of input signals is limited. Hence, the more measurements are desired to be processed the more analogue inputs are required, which results in a costly hardware extension. Apart from that, the time and effort used for wiring and installation are increased. In order to limit the costs when extending the functionality of an IED to include redundant safety ground detection, a superimposing unit is introduced which superimposes the two measurements of the response voltages and transmits them via a first analogue transmission channel to the processing device and which also superimposes the two measurements of the response currents and transmits them via a second analogue transmission channel to the processing device.

In another embodiment, three different frequencies are used to perform the safety state determination of each individual phase of a three-phase facility. Accordingly, the injection unit injects into each phase one of three test signals with each test signal at a different main frequency, the signal conversion unit measures the response voltages and currents for each phase individually and the processing device determines the impedance to ground for each phase individually and compares them with a predetermined value.

If the voltage and current values are again transmitted as analogue signals to the processing device, it is advantageous to use a superimposing unit to limit the number of required analogue transmission channels. According to an advancement of the embodiment, the superimposing unit superimposes the measurements of the response voltages of the three phases and transmits them via a first analogue transmission channel to the processing device and it superimposes the measurements of the response currents of the three phases and transmits them via a second analogue transmission channel to the processing device.

The superimposing unit preferably comprises series connected amplifiers for the voltages, where the voltages are each applied to the input of one corresponding amplifier and where the output of the serial amplifier circuit is connected to the first analogue transmission channel. The currents are preferably applied analogously to another series connection of amplifiers.

The series-connected amplifiers not only fulfill the task of superimposition of analogue signals but serve also as means to adjust the amplitudes of their outputs to match the input range of the processing device, since the maximum possible output value of the amplifiers can be determined by their supply voltage. Advantageously, this adjustment of the amplifiers can be changed and fine tuned for each new use case which ensures a high flexibility of the superimposing unit.

To obtain the response voltages and response currents from the superimposed signals, the processing device uses preferably an FFT-based algorithm (Fast Fourier Transform), which separates the different main frequencies from each other and determines complex voltage and current values.

It is advantageous to choose the main frequency or frequencies at an off-nominal value of the respective electrical facility, i.e. at a value, which can be clearly distinguished from any other harmonic present in the facility. This is especially useful in case that the facility is an AC facility or that units are added to the auxiliary system of the facility, which may function as a source of AC signals, such as speed gauges.

In case the safety state indicates a permanent short circuit fault for an electrical facility being disconnected during operation, it is furthermore possible to determine the location of the fault. This allows counter-measures for removal of the fault to be applied faster.

BRIEF DESCRIPTION OF THE DRAWINGS

The invention is now described by way of example with reference to the accompanying drawings in which.

In the example given the invention will be described in relation to a safety ground provided because of maintenance work to be performed.

DETAILED DESCRIPTION OF THE INVENTION

Figure 1:
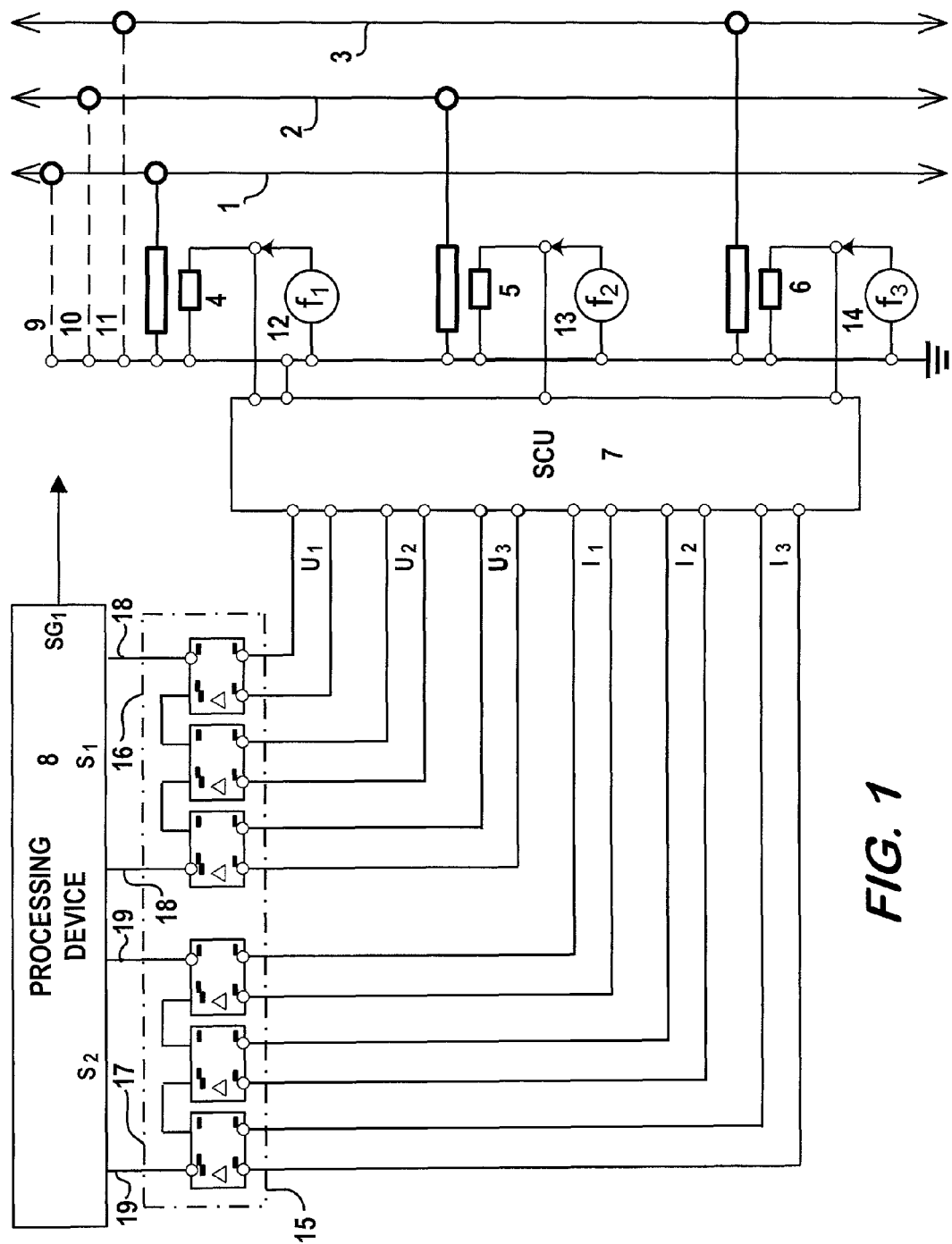
FIG. 1 shows a schematic diagram of an arrangement to determine the ground impedances of the three phases of a three-phase power line.

FIG. 1 shows a three-phase power line with the three phases 1, 2 and 3, where the power line can be a power transmission or a power distribution line. Each of the three phases 1, 2 and 3 is connected to a voltage transformer 4, 5 and 6, which is used to transform the voltages in the phase down to a measurable level. The voltage transformers 4, 5 and 6 are all connected to ground. The arrangement of voltage transformers 4, 5 and 6 is regarded in the following as an electric circuit being connected with the three-phase line, where the three-phase line is regarded as electrical facility.

A system consisting of a signal injection unit, a signal conversion unit 7 and a processing device 8 is used to measure the neutral to ground impedances of the phases 1, 2 and 3 in order to detect if a safety ground 9, 10 and 11 is present for each of the phases 1, 2 and 3. The signal injection comprises three signal generation units 12, 13 and 14, where the first signal generation unit 12 generates a first test signal $t_1$ at a first main frequency $f_1$, the second signal generation unit 13 generates a second test signal $t_2$ at a second main frequency $f_2$ and the third signal generation unit 14 generates a third test signal $t_3$ at a third main frequency $f_3$. The signals can in the simplest case be sinusoidal signals, i.e. the respective main frequency $f_1$, $f_2$ or $f_3$ is the only frequency contained in the signal. But they can also have any other suitable shape comprising multiple frequencies with one dominant frequency $f_1$, $f_2$ or $f_3$, as for example a rectangular pulse signal. The main frequencies $f_1$, $f_2$ and $f_3$ are chosen to be asynchronous to any other harmonic present in the three-phase line, so that the main frequencies $f_1$, $f_2$ and $f_3$ are distinguishable and can be picked out from the spectrum of signals measurable in the phases 1, 2 and 3.

Figure 3:
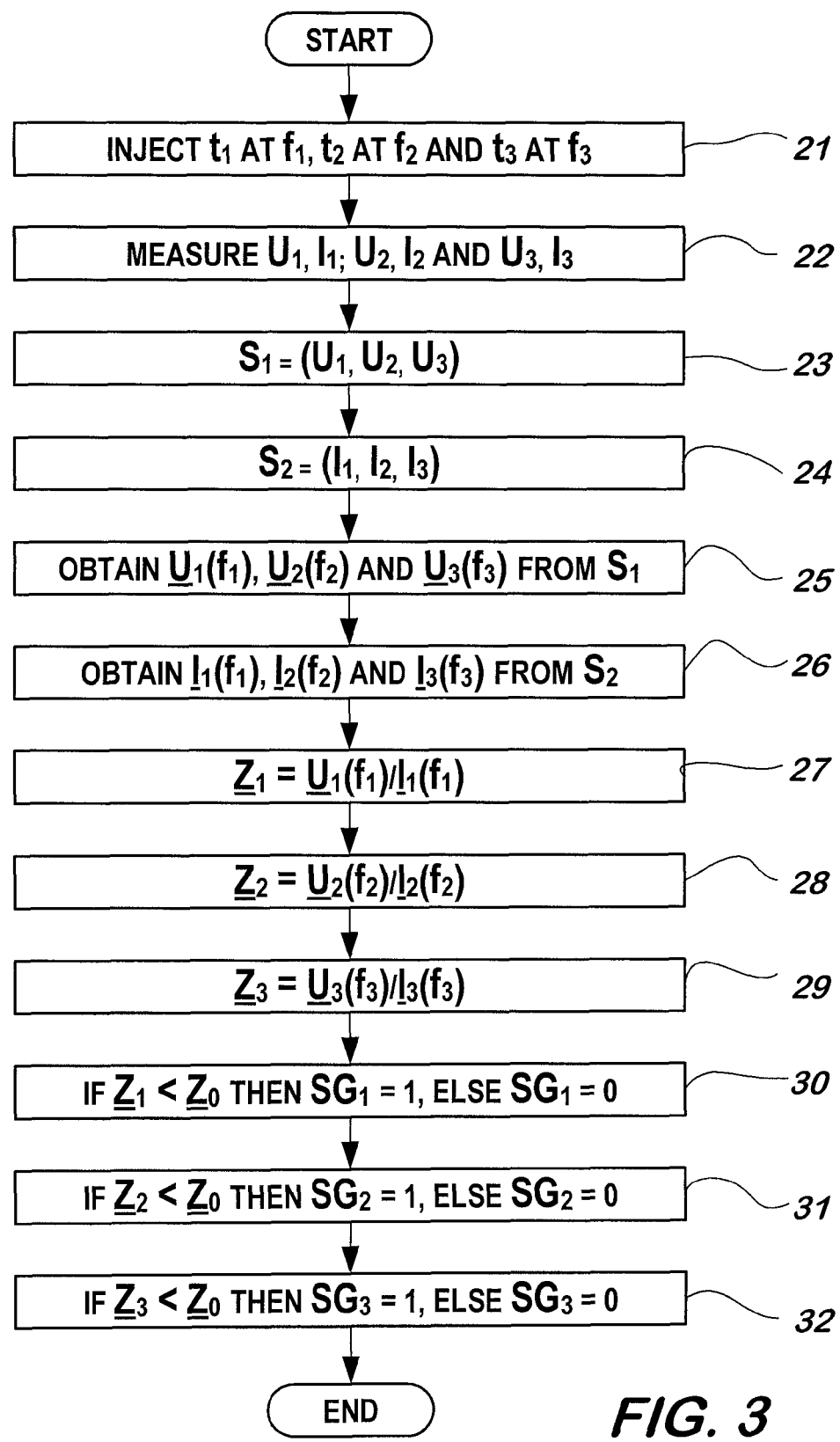
FIG. 3 shows a flow chart of a method to determine three impedances.

The first test signal $t_1$ is applied to the low voltage side of the first voltage transformer 4, thereby injecting the test signal $t_1$ into the first phase 1. The second signal $t_2$ is injected into the second transformer 5 and thereby into the second phase 2, and the third signal $t_3$ is injected into the third transformer 6 and thereby into the third phase 3. This is the beginning step 21 of a method to determine the impedances of the three phases 1, 2 and 3 of the three-phase line, as illustrated in FIG. 3. The response of the first phase 1 to the first test signal $t_1$, of the second phase 2 to the second test signal $t_2$ and of the third phase 3 to the third test signal $t_3$ is measured by the signal conversion unit 7 which is connected to the low voltage side of each of the three transformers 4, 5 and 6. The corresponding analogue voltage signals representing the measured voltage and current of the responses, respectively, are output as first voltage measurement $U_1$ and first current measurement $I_1$, as second voltage measurement $U_2$ and second current measurement $I_2$ and as third voltage measurement $U_3$ and third current measurement $I_3$. The corresponding method step 22 is shown in FIG. 3.

In order to minimize the number of inputs to the processing device 8, a superimposing unit 15 is additionally introduced into the system to measure the phase impedances. The six measurements are transmitted to the superimposing unit 15 which comprises two serial circuits of three amplifiers each, with the amplifiers 16 in the first serial circuit and the amplifiers 17 in the second serial circuit. The voltage measurements $U_1$, $U_2$ and $U_3$ are each input to one of the amplifiers 16 of the first circuit and the current measurements $I_1$, $I_2$ and $I_3$ are each input to one of the amplifiers 17 of the second circuit. Since the output of the first circuit of amplifiers 16 is connected to a first analogue transmission channel 18, superimposition of the three voltage measurements $U_1$, $U_2$ and $U_3$ is performed, thereby generating a resultant superimposed signal $S_1$. The corresponding method step is referenced as step 23. The same superimposition is performed for the three current measurements $I_1$, $I_2$ and $I_3$ via the second circuit of amplifiers 17. This is also illustrated by step 24. The resultant superimposed signal $S_2$ is transmitted to a second analogue transmission channel 19.

The processing device 8 is connected to the first and the second analogue transmission channels 18 and 19 in order to receive the superimposed signals $S_1$ and $S_2$. The processing device 8 decomposes the first superimposed signal $S_1$ to obtain the first, second and third voltage measurements $U_1$, $U_2$ and $U_3$, and it decomposes the second superimposed signal $S_2$ to obtain the first, second and third current measurements $I_1$, $I_2$ and $I_3$. The six voltage and current signals are then analyzed and processed by the processing device 8 to perform the steps described in the following. From the voltage and current measurements, the first, second and third main frequencies $f_1$, $f_2$ and $f_3$ are picked out, thereby obtaining phasors of the first, second and third response voltages and currents at the respective frequencies: $\underline{U}_1(f_1)$, $\underline{U}_2(f_2)$, $\underline{U}_3(f_3)$, $\underline{I}_1(f_1)$, $\underline{I}_2(f_2)$, $\underline{I}_3(f_3)$. This is illustrated in FIG. 3 by steps 25 and 26.

From the first voltage and current phasors, $\underline{U}_1(f_1)$ and $\underline{I}_1(f_1)$, a first impedance $\underline{Z}_1$ is calculated according to step 27, which in FIG. 1 represents the impedance of the first phase 1. From the second voltage and current phasors, $\underline{U}_2(f_2)$ and $\underline{I}_2(f_2)$, a second impedance $\underline{Z}_2$ is calculated according to step 28, which represents the impedance of the second phase 2. And from the third voltage and current phasors, $\underline{U}_3(f_3)$ and $\underline{I}_3(f_3)$, a third impedance $\underline{Z}_3$ is calculated according to step 29, which represents the impedance of the third phase 3. Then, the three impedances are analysed in order to detect the presence of a safety ground 9, 10 or 11 in each phase, by comparing the impedances with a respective predetermined value $\underline{Z}_0$, as is illustrated in steps 30, 31 and 32. If the respective impedance $\underline{Z}_1$, $\underline{Z}_2$ or $\underline{Z}_3$ is smaller than the predetermined value $\underline{Z}_0$, the presence of a safety ground in the corresponding phase is indicated by setting a flag $SG_i$, with i=1, 2 or 3. The safety ground being indicated this way is one safety state. For each of the three phases an individual flag $SG_i$ is set and output by the processing device 8 via the output channel 20, so that appropriate measures can then be initiated by an operator or a remote control unit. In the alternative, the processing device 8 can initiate the measures itself, for example generating an acoustic and/or graphic alarm if at least one of the flags //$SG_i$ is set to zero while the three-phase line is supposed to be under maintenance, or sending a blocking signal to the incoming breaker of the three-phase line if the maintenance has been completed, but at least one of the flags $SG_i$ is still set to one, thereby preventing the reconnection of the three-phase line to the power supply.

Figure 2:
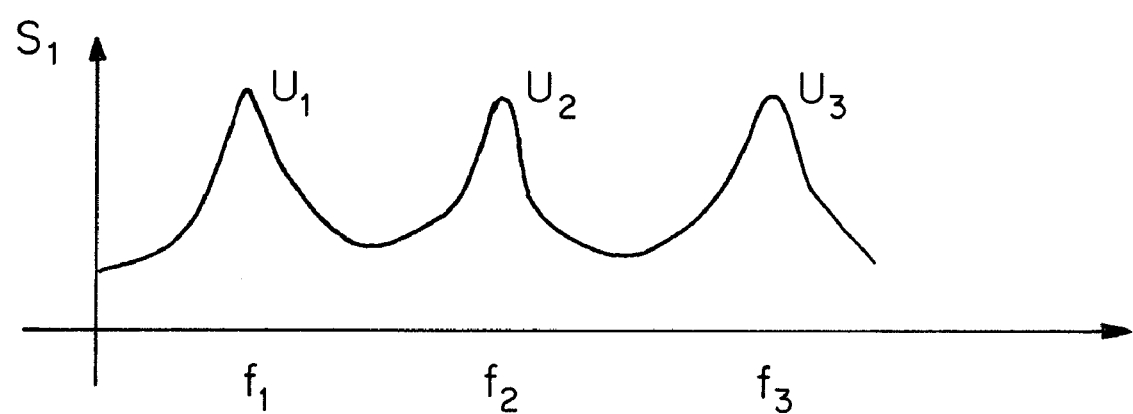
FIG. 2 illustrates the frequency spectrum of a superimposed signal.

FIG. 2 illustrates the frequency spectrum of the superimposed signal $S_1$ containing the three voltage measurements $U_1$, $U_2$ and $U_3$. It is an example of how the three frequencies $f_1$, $f_2$ and $f_3$ can be distributed over the frequency spectrum, in order to show that it is important to choose the three frequencies $f_1$, $f_2$ and $f_3$ with an adequate bandwidth between them so that their corresponding voltage or current signals can be clearly distinguished from each other.

The example above of the present invention was given in relation to a safety ground. As an alternative or additionally, the present invention may be used in relation to a short-circuit fault occurring in one or more power lines (or other types of electric facilities). In this case the electrical facility is connected to the system via one or more circuit breaker and perhaps to a load via a circuit breaker. In case a fault occurs in operation of the system, these circuit breakers may be opened in order to clear the fault. Such a fault may for instance be caused by lightning hitting the electrical facility. In this case the operation of the system thus causes the electrical facility to be disconnected from the system. Normally such a circuit breaker is then kept open during a disconnection time interval. Then at the end of this disconnection time interval the circuit breaker would also normally try to close again and reconnect the electrical facility to the system. According to the invention the above-mentioned way of determining the impedances to ground is used also during such a disconnection time interval. The impedances to ground are thus monitored and analysed during this time interval. Based on the analysis a temporary or a permanent short-circuit fault may be indicated. A safety state is thus determined indicating a permanent short circuit fault or a temporary short circuit fault based on the change of the impedance to ground during the disconnection time interval. If the system is a three-phase system, this may be done for each of the phases. In case the determined impedance to ground remains below the predetermined value for the duration of the time interval for any of the phases a permanent short-circuit fault may be indicated, while if the impedance rises above the predetermined value for all of the phases before the time interval has expired a temporary fault may be indicated. Here the time interval may be about half a second long. In the case of a temporary fault the above mentioned circuit breakers may be allowed to reconnect the electrical facility to the system, while if a permanent fault is indicated the disconnection of the electrical facility is prolonged beyond the end of the disconnection time interval. This means that re-closing of the circuit breakers is blocked. This blocking is kept until the fault has been removed.

In order to be able to more easily remove the fault, it is here also possible to determine the location of the fault, which is of advantage when for instance the electrical facility is a long power line. Also the location of the fault may be determined using the above-mentioned way of determining the impedance to ground seen from the injection unit. In this case the distance to the fault is determined through comparing the imaginary part of an impedance, possibly compensated with the impedance of the electric circuit, with the reactance of the electrical facility. In the example of FIG. 1, the impedance as seen by an injection unit is thus compensated with the impedance of the corresponding transformer. Therefore the imaginary part of this compensated impedance is compared with the reactance of the line.

What is claimed is:

1. A system to determine an impedance of an electrical facility being disconnected from its high or medium voltage power supply, comprising:
   a signal injection unit arranged to inject a test signal at a first main frequency between a reference point of an electric circuit and ground and to inject another test signal at a second main frequency between a reference point of the electric circuit and ground, where the electric circuit is connected with the facility;
   a signal conversion unit arranged to measure a first response voltage and a first response current in the electric circuit, where the first response voltage and the first response current result from the test signal and to measure a second response voltage and a second response current as a result to the other test signal; and
   a processing device arranged to determine an impedance to ground of the facility from the first response voltage and the first response current and to determine another impedance to ground from the second response voltage and second response current to analyse impedances to ground of the facility, said analysing including comparing each determined impedance to ground with a predetermined value, and to determine a safety state of the disconnected electrical facility based on the analysed impedances to ground.

2. The system according to claim 1, wherein the electrical facility is a power transmission or distribution line.

3. The system according to claim 1, wherein the electrical facility is a capacitor bank in a power network.

4. The system according to claim 1, wherein the electrical facility is a transformer in a substation of a power network.

5. The system according to claim 1, wherein the electrical facility is a breaker in a substation of a power network.

6. The system according to claim 1, wherein the processing device, when being arranged to determine a safety state, is arranged to determine an existing safety ground if at least one impedance is smaller than the predetermined value.

7. The system according to claim 6, wherein a control unit initiates an alarm in case the processing device signals no present safety ground.

8. The system according to claim 6, wherein a control unit prevents the application of a high or medium voltage to the facility in case the processing device signals a present safety ground.

9. The system according to claim 1, wherein the processing device when being arranged to analyse impedance to ground is arranged to analyse an impedance to ground over time during a disconnection time interval for the electrical facility and when being arranged to determine a safety state is arranged to indicate a permanent short circuit fault or a temporary short circuit fault based on a change of the impedance to ground during the disconnection time interval.

10. The system according to claim 9, wherein the processing device is arranged to prolong disconnection of the electrical facility beyond an end of the disconnection time interval if the safety state indicates a permanent short circuit fault.

11. The system according to claim 10, wherein the processing device is further arranged to determine a distance to the fault in the electrical facility from the injection unit based on the determined impedance to ground.

12. The system according to claim 11, wherein the distance to the fault is determined through comparing an imaginary part of the impedance seen from the injection unit, with the reactance of the electrical facility.

13. The system according to claim 1, where
   the electrical facility is a three-phase facility;
   the injection unit injects a further test signal at a third main frequency, where one test signal is injected into each phase, the signal conversion unit measures a third response voltage and a third response current as a result to the further test signal; and
   the processing device determines a further impedance to ground from the third response voltage and third response current and compares it with the predetermined value.

14. The system according to claim 13, wherein a superimposing unit superimposes the measurements of the response voltages and transmits them via a first analogue transmission channel to the processing device and where the superimposing unit superimposes the measurements of the response currents and transmits them via a second analogue transmission channel to the processing device.

15. The system according to claim 14,
   where the superimposing unit comprises for each of the measurements of the response voltages an amplifier with the corresponding voltage connected to its input; and
   where the amplifiers are connected in series and the output of their serial circuit is connected to one of the analogue transmission channels.

16. The system according to claim 15, where said analogue transmission channel is the first analogue transmission channel.

17. The system according to claim 15, where said analogue transmission channel is the second analogue transmission channel.

18. The system according to claim 1, where in case that the electrical facility is an AC facility, the main frequency or frequencies are off-nominal frequencies of the facility.

19. The system according to claim 12, wherein the imaginary part of the impedance seen from the injection unit is compensated with the impedance of the electric circuit.

20. A method to determine an impedance of an electrical facility being disconnected from its high or medium voltage power supply, comprising:

injecting a test signal at a main frequency between a reference point of an electric circuit and ground and injecting another test signal at a second main frequency between a reference point of the electric circuit and ground, where the electric circuit is connected with the facility;

measuring a first response voltage and a first response current in the electric circuit, where the first response voltage and the first response current result from the test signal, measuring a second response voltage and a second response current as a result to the other test signal;

determining an impedance to ground of the facility from the first response voltage and the first response current and determining another impedance to ground from the second response voltage and second response current;

analysing the impedances to ground of the facility, said analysing including comparing each determined impedance to ground with a predetermined value; and determining a safety state of the disconnected electrical facility based on the analysed impedances to ground.

\* \* \* \* \*